United States Patent
Kilmer et al.

(10) Patent No.: US 8,799,566 B2
(45) Date of Patent: Aug. 5, 2014

(54) MEMORY SYSTEM WITH A PROGRAMMABLE REFRESH CYCLE

(75) Inventors: Charles A. Kilmer, Essex Junction, VT (US); Kyu-hyoun Kim, Mount Kisco, NY (US); Warren E. Maule, Cedar Park, TX (US); Vipin Patel, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 689 days.

(21) Appl. No.: 12/963,797

(22) Filed: Dec. 9, 2010

(65) Prior Publication Data
US 2012/0151131 A1 Jun. 14, 2012

(51) Int. Cl.
*G06F 12/00* (2006.01)
*G11C 7/00* (2006.01)

(52) U.S. Cl.
USPC .......................................... 711/106; 365/222

(58) Field of Classification Search
USPC .......................................... 365/222; 711/106
See application file for complete search history.

(56) References Cited

U.S. PATENT DOCUMENTS

| | | | | |
|---|---|---|---|---|
| 5,703,823 | A * | 12/1997 | Douse et al. | 365/222 |
| 6,215,714 | B1 * | 4/2001 | Takemae et al. | 365/222 |
| 6,219,292 | B1 * | 4/2001 | Jang | 365/222 |
| 6,618,314 | B1 * | 9/2003 | Fiscus et al. | 365/227 |
| 8,264,903 | B1 * | 9/2012 | Lee et al. | 365/222 |
| 2002/0040417 | A1 * | 4/2002 | Winograd et al. | 711/106 |
| 2008/0130394 | A1 * | 6/2008 | Dono et al. | 365/222 |
| 2010/0318733 | A1 * | 12/2010 | Seo et al. | 711/106 |
| 2012/0051169 | A1 * | 3/2012 | Lee | 365/222 |

* cited by examiner

*Primary Examiner* — Reginald Bragdon
*Assistant Examiner* — Mehdi Namazi
(74) *Attorney, Agent, or Firm* — Cantor Colburn LLP

(57) ABSTRACT

A memory system with a programmable refresh cycle including a memory device that includes a memory array of memory cells and refresh circuitry that is in communication with the memory array and with a memory controller. The refresh circuitry is configured to receive a refresh command from the memory controller and for refreshing a number of the memory cells in the memory device in response to receiving the refresh command. The number of memory cells refreshed in response to receiving the refresh command is programmable.

13 Claims, 18 Drawing Sheets

400

| MRS (REFRESH CYCLE <1:0>) | NUMBER OF CELLS THAT ARE REFRESHED AT ONE TIME | NUMBER REFRESH OPERATIONS PER CHIP (REFRESH CYCLE) | AVERAGE REFRESH CYCLE TIME (tREFI) | MINIMUM REFRESH CYCLE TIME (tRFC) |
|---|---|---|---|---|
| 00 | NORMAL | $2^p$ | X1 | LONG |
| 01 | HALF | $2^{(p+1)}$ | X1/2 | MEDIUM |
| 10 | QUARTER | $2^{(p+2)}$ | X1/4 | SHORT |
| 11 | 1/8 | $2^{(p+3)}$ | X1/8 | SHORTER |

| MRS (Ax, Ay) | MODE | 4Gb | | 8Gb | | 16Gb | |
|---|---|---|---|---|---|---|---|
| | | tRFC | tREFI | tRFC | tREFI | tRFC | tREFI |
| 00 | NORMAL | 300ns | 7.8us | 560ns | 7.8us | 560ns | 3.9us |
| 01 | 1/2 | 160ns | 3.9us | 300ns | 3.9us | 300ns | 1.95us |
| 10 | 1/4 | 110ns | 1.95us | 160ns | 1.95us | 160ns | 975ns |
| 11 | 1/8 | 75ns | 975ns | 110ns | 975ns | 110ns | 487.5ns |

*FIG. 12*

| NUMBER OF RANKS | DRAM DEVICE DENSITY | | | |
|---|---|---|---|---|
| | 2Gb | 4Gb | 8Gb | 16Gb |
| 1 | X1/2 | X1/4 | X1/8 | X1/8 |
| 2 | X1 | X1/2 | X1/4 | X1/8 |
| 4 | X1 | X1 | X1/2 | X1/4 |
| 8 | X1 | X1 | X1 | X1/2 |

1500

|  | DRAM DEVICE DENSITY | | | |
|---|---|---|---|---|
|  | 2Gb | 4Gb | 8Gb | 16Gb |
| tRFC (base) | 160ns | 300ns | 560ns | 560ns |
| tREFI (base) | 7.8us | 7.8us | 7.8us | 3.9us |

*FIG. 15*

MEMORY SYSTEM WITH A PROGRAMMABLE REFRESH CYCLE

BACKGROUND

The present invention relates to memory systems, and more specifically, to a memory system with a programmable refresh cycle.

As processor speeds continue to increase, memory performance becomes more of a limiting factor in system performance and therefore, memory performance must increase as well. An important aspect of increasing memory performance is increasing the throughput of memory systems. Some memory devices, such as direct random access memory (DRAM) devices require periodic refreshing of their memory cells to prevent data loss. In order to perform a refresh, a memory device enters a refresh mode where the DRAM is not accessible until the refresh has completed execution.

Memory controllers issue refresh commands on a periodic basis so that all memory cells in a DRAM device are refreshed at least once in every predetermined refresh period. The length of the refresh period is dictated by the memory device specifications, with a typical DRAM memory cell requiring a refresh every sixty four milliseconds (64 ms). The number of memory cells refreshed in a single refresh operation is typically fixed and determined by both the total number of cells in the memory device and the total number of refresh commands issued in each refresh period (referred to as a refresh interval). For example, if a memory device having eight thousand bits (8 Kbits) and a refresh period of 64 ms may have a refresh interval of 7.8 microseconds (m$\mu$) and will refresh one bit during a single refresh cycle (64 ms/8192 bits=7.8 m$\mu$. The number of refreshed cells per refresh cycle increases proportionally to the device density. For example, in a one gigabit (1 Gbit) memory device having a refresh period of 64 ms and a refresh interval of 7.8 m$\mu$, 128 Kbits are refreshed in one refresh cycle. For a 2 Gbit memory device, having a refresh period of 64 ms and a refresh interval of 7.8 m$\mu$, 256 Kbits are refreshed in one refresh cycle (twice as many as during a refresh interval in a 1 Gbit memory device).

The DRAM is not accessible when it is executing the refresh command because typically the banks are refreshed at the same time so there is no available bank for normal access during the refresh period. The memory controller waits until the internal refresh operation has completed before resuming normal operation (e.g., before sending another command such as a read or write command). This period of time when the DRAM is not accessible is referred to as lockout time. The lockout time is equal to the delay required between two back-to-back refresh commands (referred to the minimum refresh cycle time or tRFC).

A drawback of higher density memory devices is that the lockout time increases as more and more cells require refreshing during each refresh cycle. Another drawback is that more noise is generated when more cells are being refreshed in the same cycle. As described previously, an increase in the amount of lockout time required for completing refresh operations has a direct impact on memory system throughput.

Accordingly, and while existing memory systems may be suitable for their intended purposes, there remains a need in the art for memory systems that overcome these drawbacks for high density memory devices.

SUMMARY

An embodiment is a memory device that includes a memory array of memory cells and refresh circuitry that is in communication with the memory array and with a memory controller. The refresh circuitry is configured for receiving a refresh command from the memory controller and for refreshing a number of the memory cells in the memory device in response to receiving the refresh command. The number of memory cells refreshed in response to receiving the refresh command is programmable.

Another embodiment is a memory controller that includes a table correlating recommended refresh cycle settings to memory system configurations and a refresh cycle timing controller. The refresh cycle timing controller is configured for detecting a memory system configuration, the memory system configuration including a density of a memory device. The table is accessed to locate a recommended refresh cycle setting that correlates to the detected memory system configuration, and a refresh cycle time (tRFC) is calculated for the memory device in response to the recommended refresh cycle setting and to a base tRFC for the memory device. A refresh cycle interval (tREFI) for the memory device is calculated in response to the recommended refresh cycle setting and to a base tREFI for the memory device. Refresh commands are transmitted to the memory device at the tREFI and the memory controller waits for the tRFC to elapse after transmitting each refresh command before transmitting a subsequent command to the memory.

A further embodiment is a method for refreshing a memory device. The method includes detecting a memory system configuration, the detecting at a memory controller and the memory system configuration comprising a density of a memory device. A table that correlates recommended refresh cycle settings to memory system configurations is accessed to locate a recommended refresh cycle setting that correlates to the detected memory system configuration. A tRFC is calculated for the memory device in response to the recommended refresh cycle setting and to a base tRFC for the memory device. A tREFI is calculated for the memory device in response to the recommended refresh cycle setting and to a base tREFI for the memory device. Refresh commands are transmitted to the memory device at the tREFI. The memory controller waits for an amount of time at least equal to the tRFC to elapse after transmitting each refresh command before transmitting a subsequent command to the memory.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 depicts values that may be stored in a refresh cycle mode register in accordance with an embodiment;

FIG. 6, which includes

FIG. 7, which includes

FIG. 12 depicts values that may be stored in a refresh cycle mode register in accordance with an embodiment;

FIG. 15 depicts values that may be stored in a base minimum refresh cycle time (tRFC)/average refresh cycle interval (tRFI) table and accessed by a memory controller in accordance with an embodiment.

DETAILED DESCRIPTION

Figure 1:
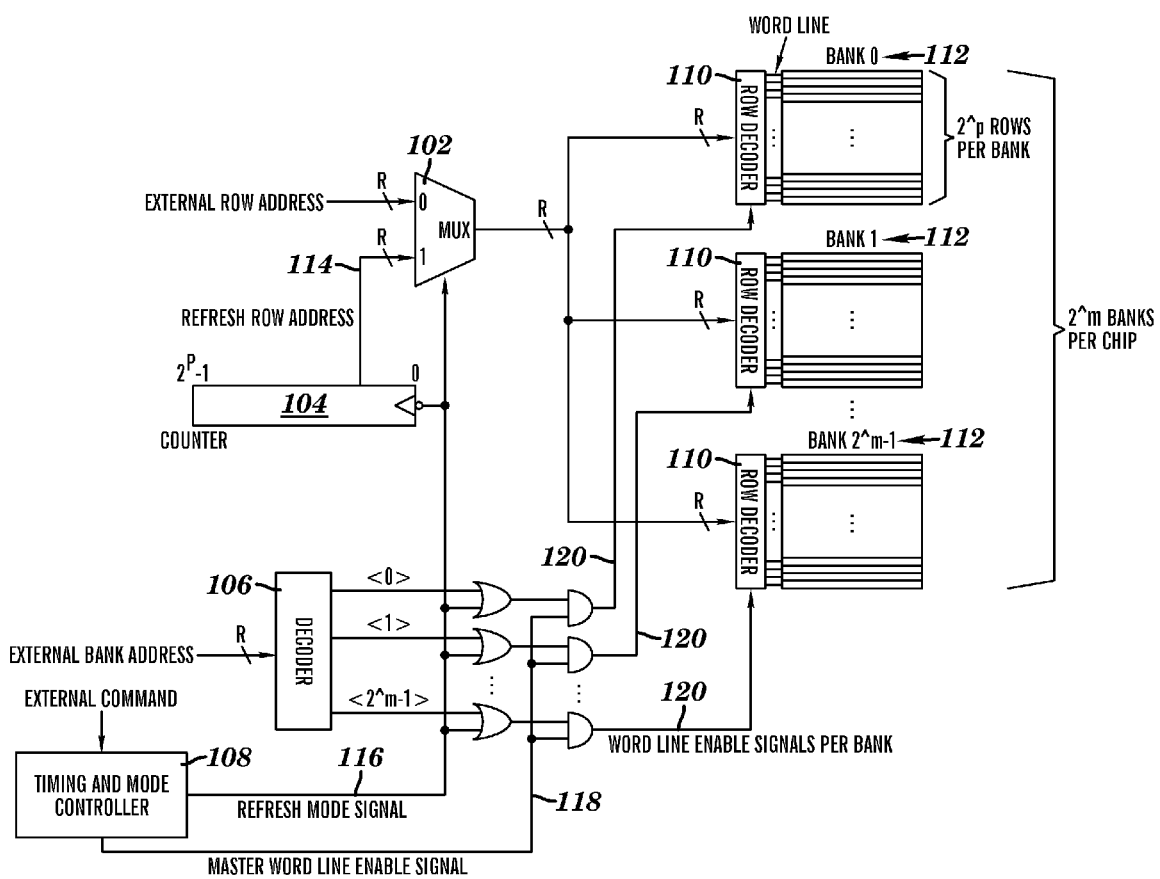
FIG. 1 depicts a block diagram of a contemporary direct random access memory (DRAM) device.

An embodiment provides the ability for a direct random access memory (DRAM) device to implement a smaller sub-refresh operation via a programmable average refresh cycle interval. This allows a fewer number of memory cells to be refreshed in response to each refresh command, however it requires the memory controller to issue refresh commands more frequently to the memory device. The frequency of the refresh command and the number of cells refreshed in each refresh cycle is selectable so that a user or the memory controller can choose different modes. In an embodiment, the memory controller determines an optimum average refresh cycle for the memory device and programs the memory device with the value.

As used herein, the term "refresh period" refers to the maximum amount of time that can pass between refreshes on a memory cell in order for the memory cell to retain its value. The length of the refresh period is dictated by the memory device specifications and contemporary DRAM memory cells require a refresh every sixty four milliseconds (64 ms).

As used herein, the term "average refresh cycle interval" (tREFI) refers to how often the memory controller issues refresh commands to the memory device. In embodiments described herein, the tREFI is selectable.

As used herein, the terms "minimum refresh cycle time" and "lock out time", used interchangeably and abbreviated as "tRFC", refer to the period of time when a refresh command is executing and the DRAM is not accessible. The tRFC is equal to the delay required between two back-to-back refresh commands. As used herein, the term "total lockout time" or "total tRFC" refers to the total amount of time during each refresh period that the memory device is not available for normal operation due to refresh command processing.

When a smaller number of cells are refreshed in each tREFI, the tRFC is shorter. However, refreshing "N/2" memory cells requires slightly more than half the amount of time required to refresh "N" memory cells. This is because a constant amount of time is added to each refresh operation due to overhead associated with refresh commands (e.g., sense amplifier time and address decode time). In an embodiment, this constant amount of time is equal to sixty nano seconds (60 ns), and the tRFC is equal to 60 ns+the number of cells being refreshed (in Gbits) multiplied by 50 ns (tRFC=60 ns+density in Gbits*50 ns). The total lockout time in each refresh period is equal to tRFC×the number of refresh commands issued within the refresh period. Thus, there exists some optimum point for tRFC where the memory bandwidth can be maximized. However, this optimum point is a function of DRAM device density and memory configuration (number of ranks, number of channels and ports, etc.). In an embodiment, the tRFC is programmable, allowing an optimum setting to be chosen depending on memory configurations.

The term DRAM is used herein when describing embodiments. It will be appreciated that any memory device that requires periodic refreshing of memory cells to retain stored values may benefit from embodiments described herein. Thus, embodiments described herein are not limited to DRAM devices and embodiments include any memory device requiring a periodic refresh.

FIG. 1 depicts a block diagram of a contemporary direct random access memory (DRAM) device. The DRAM shown in FIG. 1 includes $2^m$ memory banks 112, with each memory bank 112 having $2^p$ rows and each memory bank 112 corresponding to a row decoder 110 for selecting rows in the memory bank 112. A selected row is output from a multiplexer 102 and is input to the row decoder 110. As shown in FIG. 1, the multiplexer 102 selects an external row address (e.g., from a read command, from a write command) or a refresh row address 114 from a refresh counter 104. The multiplexer 102 makes this selection based on a value of a refresh mode signal 116 that is output from a timing and mode controller 108. The timing and mode controller 108 issues the refresh mode signal 116 in response to receiving an external command (e.g., a refresh command received from a memory controller). Also shown in FIG. 1 is a master word line enable signal 118 that is output by the timing and mode controller 108 when the refresh mode signal 116 is output to select all of the banks, using bank word line enable signals 120 on the memory device for refresh. The master word line enable signal 118 selects all of the banks and overrides the output from the decoder 106 which selects a single bank based on a received external bank address (e.g., from a read command, from a write command).

Figure 2:
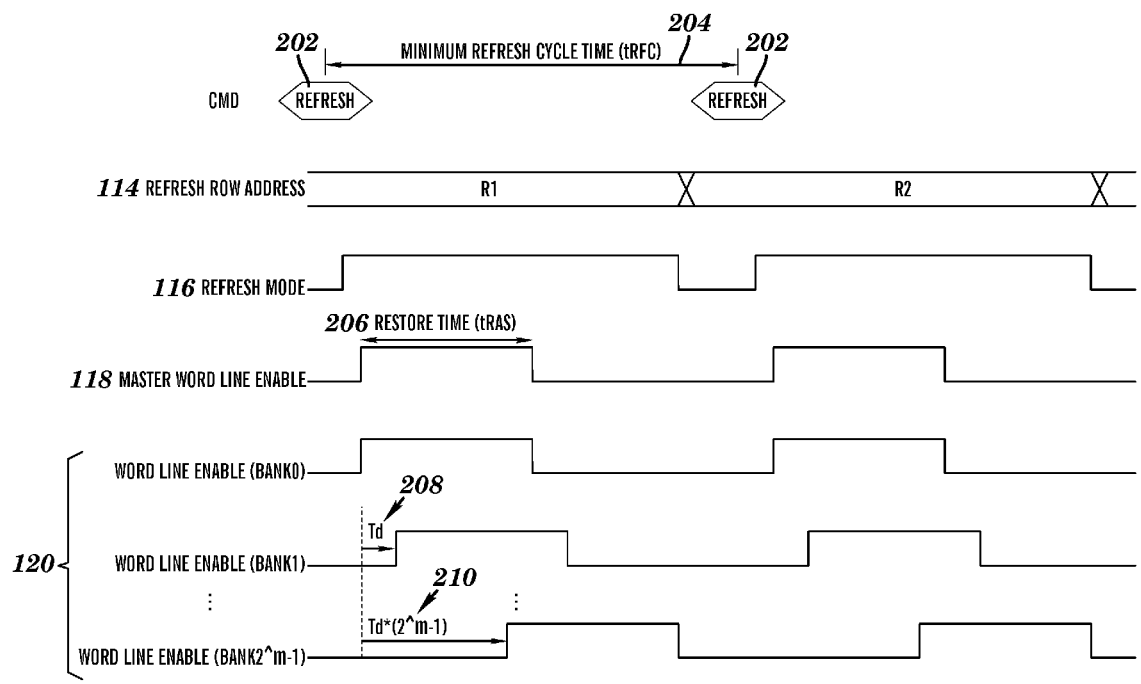
FIG. 2 depicts an internal refresh timing diagram of a contemporary DRAM device.

FIG. 2 depicts an internal refresh timing diagram of a contemporary DRAM device. As shown in FIG. 2, a refresh command 202 is issued to a memory device. In response to receiving the refresh command 202, the refresh mode signal 116, master word line enable signal 118 are activated (in this example set high to "1"). In response to the refresh mode signal 116 being set high, a refresh row address is selected from the counter 104. Depending on how the refresh command 202 is implemented, the refresh command may cause one row or many rows (e.g., starting at row address R1) in each bank to be refreshed. In response to the master word line enable signal 118 being set high, the bank word line enable signals 120 are activated (in this example set high to "1") to refresh memory cells in their respective banks at the refresh row address specified by R1. The master word line enable signal 118 stays high for at least an amount of time equal to a defined restore time (tRAS) 206. Another refresh command 202 (or other command such as a read command or write command) cannot be issued until a minimum refresh cycle time or tRFC 204 has completed.

As shown in FIG. 2, the refreshes are divided such that accesses to banks subsequent to the first bank are staggered by a time delay (Td) 208 up to Td time $2^{m-1}$ 210 to limit peak internal noise. For higher density devices, the internal refresh is typically divided into more sub-refreshes and the total length of staggered time increases, thus increasing the lockout time (tRFC) for higher density devices. As described previously, a typical tRFC of industry standard DRAM is equal to 60 ns+(Density/Gbit)*50 ns. For example, in an 8 Gbit DRAM, the tRFC is equal to 460 ns, which means that access to the memory device would be halted for that amount of time. Assuming that a typical memory command has a latency of 25 ns, 460 ns of lockout causes a worse case latency that is twenty times longer than the average latency.

Figure 3:
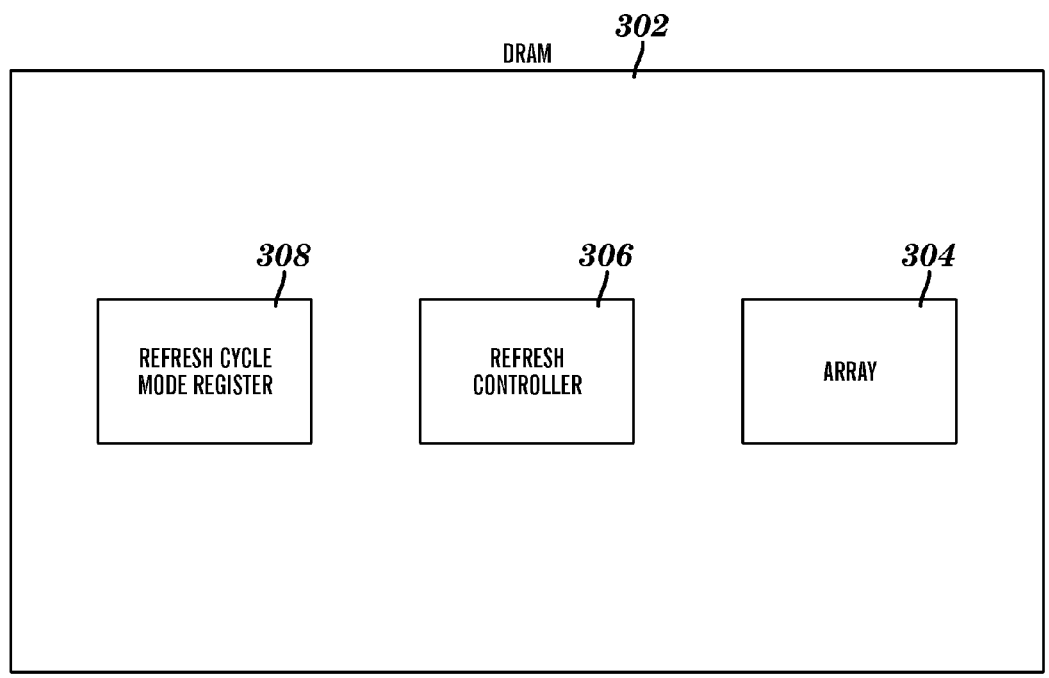
FIG. 3 depicts a high level block diagram of a memory device that includes a refresh cycle mode register in accordance with an embodiment.

FIG. 3 depicts a high level block diagram of a memory device 302 in accordance with an embodiment. The memory device 302 (e.g., a DRAM device) shown in FIG. 3 includes a storage array 304 (e.g., a DRAM storage array), a refresh controller 306, and a refresh cycle mode register 308. In an embodiment, the refresh controller 306 operates in a manner that is similar to the timing and mode controller 108 described in reference to FIG. 1; it receives a refresh command and initiates a refresh process at the memory device 302 in response to receiving a refresh command from a memory controller. In addition, the memory device 302 also includes a refresh cycle mode register 308 which is utilized to determine how many memory cells should be refreshed by the memory device in response to each refresh command received from the memory controller. In an embodiment, the refresh mode register 308 stores a value that represents the number of memory cells that should be refreshed in response to each refresh command and is set/reset by the memory controller. In an embodiment, the value is stored as part of memory device initialization. In another embodiment, the value is also updated by the memory controller during system run time.

FIG. 4 depicts values that may be stored in a refresh cycle mode register in accordance with an embodiment. As shown in FIG. 4: the value "00" stored in the refresh mode register 308 corresponds to a "normal" number of cells being refreshed in each of $2^p$ refresh operations in a refresh period, to a tREFI of "X" and to a "long" tRFC; the value "01" stored in the refresh mode register 308 corresponds to a "half" of the number of cells being refreshed in each of $2^{p+1}$ refresh operations in a refresh period, to a tREFI of "X/2" and to a "medium" tRFC; the value "10" stored in the refresh mode register 308 corresponds to a "quarter" of the number of cells being refreshed in each of $2^{p+2}$ refresh operations in a refresh period, to a tREFI of "X/4" and to a "short" tRFC; the value "11" stored in the refresh mode register 308 corresponds to "one eighth" of the number of cells being refreshed in each of $2^{p+3}$ refresh operations in a refresh period, to a tREFI of "X/8" and to a "shorter" tRFC. The memory controller utilizes the value to determine how many cells need to be refreshed in response to each refresh command received from the memory controller (referred to in the table as "number of cells that are refreshed at one time").

In one embodiment, where the memory device is a 1 Gbit DRAM device, the refresh period is 64 ms and p is equal to three, the value "00" stored in the refresh mode register 308 corresponds to 128 Kbit cells being refreshed in each of 8 refresh operations in a refresh period of 64 ms, to a tREFI of 7.8 μs and to a tRFC 300 μs; the value "01" stored in the refresh mode register 308 corresponds to 64 Kbit cells being refreshed in each of 16 refresh operations in a refresh period of 64 ms, to a tREFI of 3.9 μs and to a tRFC of 160 μs; the value "10" stored in the refresh mode register 308 corresponds to a 32 Kbits being refreshed in each of 32 refresh operations in a refresh period of 64 ms, to a tREFI of "1.95 μs and to a tRFC of 110 μs; the value "11" stored in the refresh mode register 308 corresponds to 16 Kbits being refreshed in each of 64 refresh operations in a refresh period of 64 ms, to a tREFI of 0.975 and to a tRFC of 75 μs. These values are intended to be exemplary in nature, as the values will vary between different memory system configurations.

Figure 5:
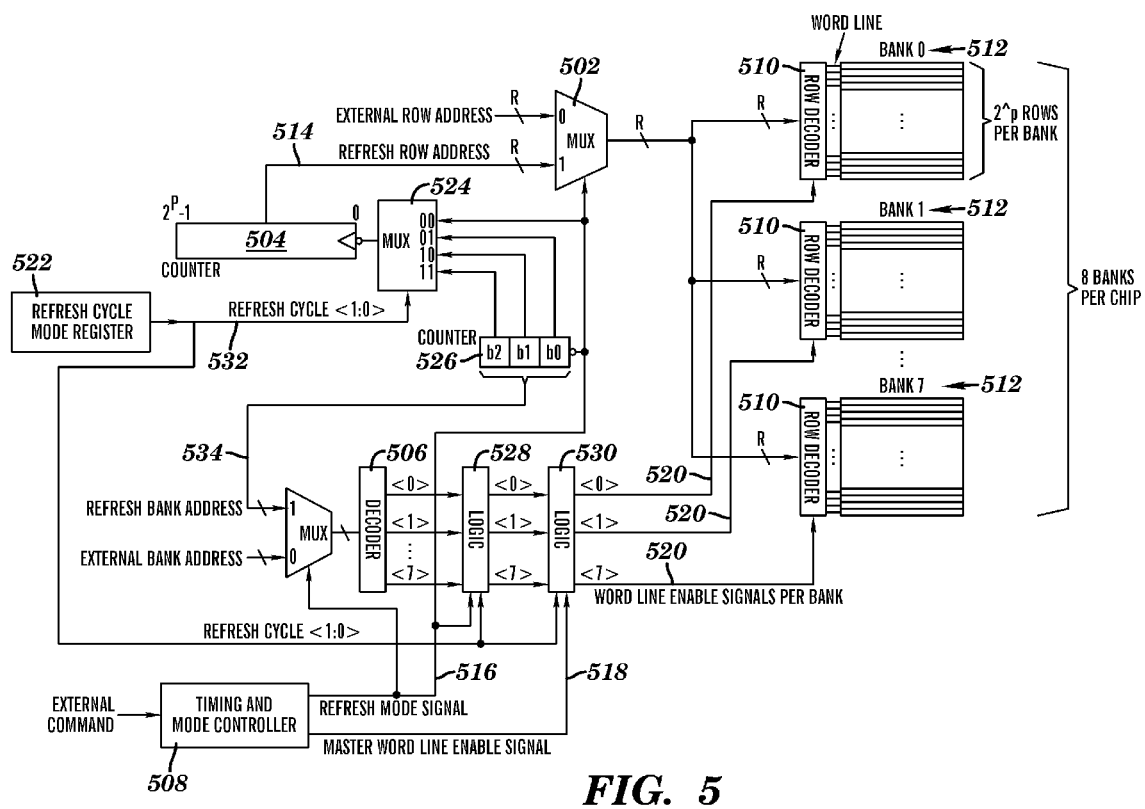
FIG. 5 depicts a block diagram of a memory device that includes a refresh cycle mode register in accordance with an embodiment.

FIG. 5 depicts a block diagram of a memory device that includes a refresh cycle mode register 522 in accordance with an embodiment. The DRAM shown in FIG. 5 supports a variable number of memory cells being refreshed in response to each refresh command via the use of a programmable refresh cycle mode value stored in the refresh cycle mode register 522. The DRAM shown in FIG. 5 includes 8 memory banks 512, with each memory bank 512 having $2^p$ rows and each memory bank 512 corresponding to a row decoder 510 for selecting rows in the memory bank 512. A selected row is output from a multiplexer 502 and is input to the row decoder 510. As shown in FIG. 5, the multiplexer 502 selects an external row address (e.g., from a read command, from a write command) or a refresh row address 514 from a refresh counter 504. The multiplexer 502 makes this selection based on a value of a refresh mode signal 516 that is output from a timing and mode controller 508. The timing and mode controller 508 issues the refresh mode signal 516 in response to receiving an external command (e.g., a refresh command received from a memory controller).

Circuitry is included in the DRAM device of FIG. 5 to support a variable number of bits being refreshed in each tREFI, where the number of bits to be refreshed is indicated by a refresh cycle mode value stored in the refresh cycle mode register 522. The refresh cycle mode value stored in the refresh cycle mode register 522 is input to multiplexer 524, logic 528, and logic 530 to drive the refresh process including selecting banks 512 for refresh, which in turn causes a selected number of cells to be refreshed in the current refresh cycle in response to the refresh command received from the memory controller.

In the embodiment depicted in FIG. 5, if the refresh cycle mode value stored in the refresh cycle mode register 522 is "00" then bits in all of the banks 512 are to be refreshed in the current refresh cycle and the bits in counter 512 are ignored. If the value is "01", "10" or "11", then bits in a subset of the banks 512 will be refreshed. The counter 526 is used to keep track of how many banks 512 have been refreshed at a current row location so that all banks 512 will be refreshed at the current row location before moving to a next row location for refresh. In an embodiment, a refresh cycle mode value of "10" in the refresh cycle mode register 522 corresponds to refreshing four of the banks 512 in response to a refresh command from the memory controller, a value of "10" to refreshing two of the banks 512, and a value of "11" to refreshing one bank 512. The counter 526 is updated in response to receiving the refresh mode signal.

In addition, contents of the counter 526 are input to multiplexer 534 as a three bit refresh bank address. The multiplexer 534 selects the refresh bank address using the refresh mode signal 516 as a selector and the decoder 506 receives the three bit bank refresh address from the multiplexer 534. The decoder 506, logic 528, and logic 530 shown in FIG. 5 are used to activate one or more banks 512 for refresh during the current refresh cycle. In an embodiment, the decoder 506 receives the refresh bank address and generates bank selection signals. Logic 528 receives input from the decoder 506, the refresh cycle signal 516, and the refresh cycle mode value 532 stored in the refresh cycle mode register 522. Logic 528 uses this data to determine which banks should be refreshed in the current refresh cycle. Logic 530 receives an indication of which banks should be refreshed from logic 528, as well as the refresh cycle mode value 516 and the master word line enable signal 518 and generates word line enable signals 520 for banks to be refreshed in the current refresh cycle.

Figure 6A:
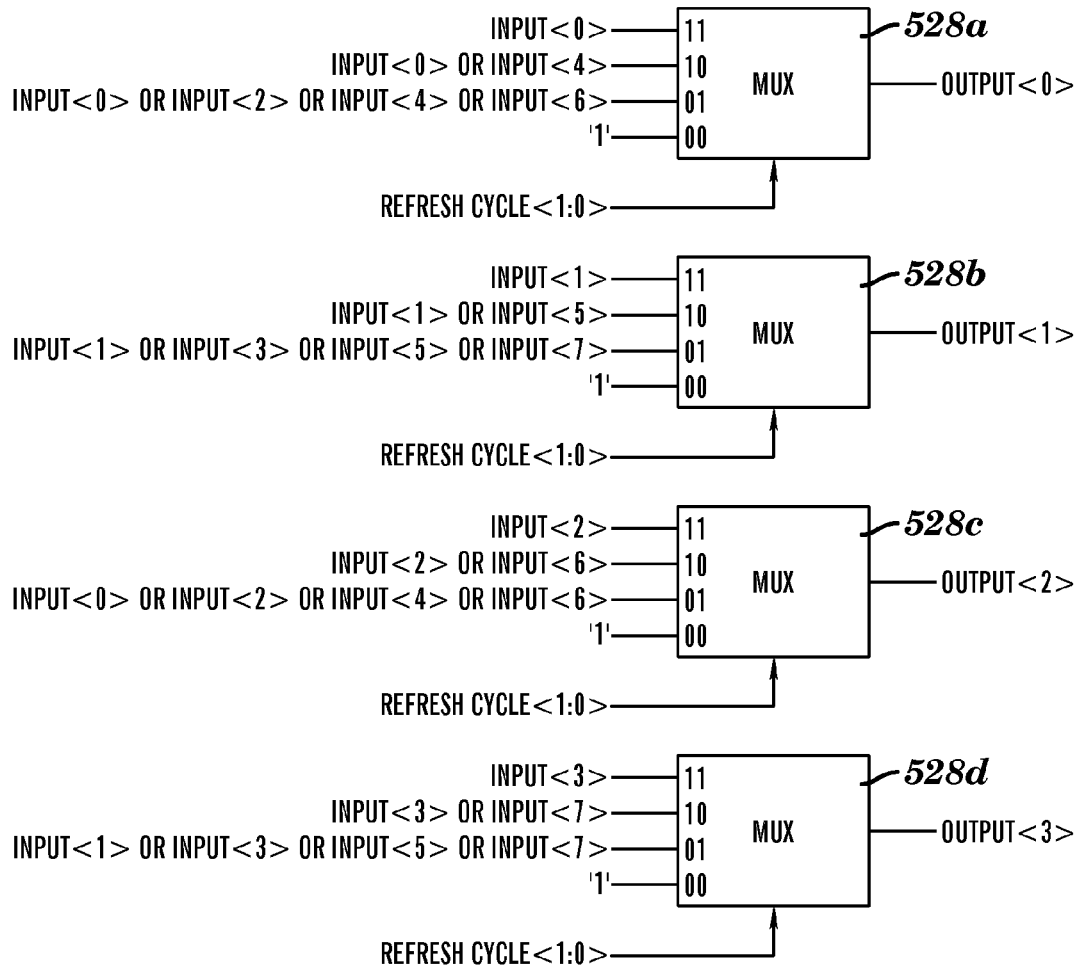
FIGS. 6A and 6B, depicts logic implemented by the memory device depicted in FIG. 5 to provide programmable refresh cycle intervals in accordance with an embodiment.
Figure 6B:
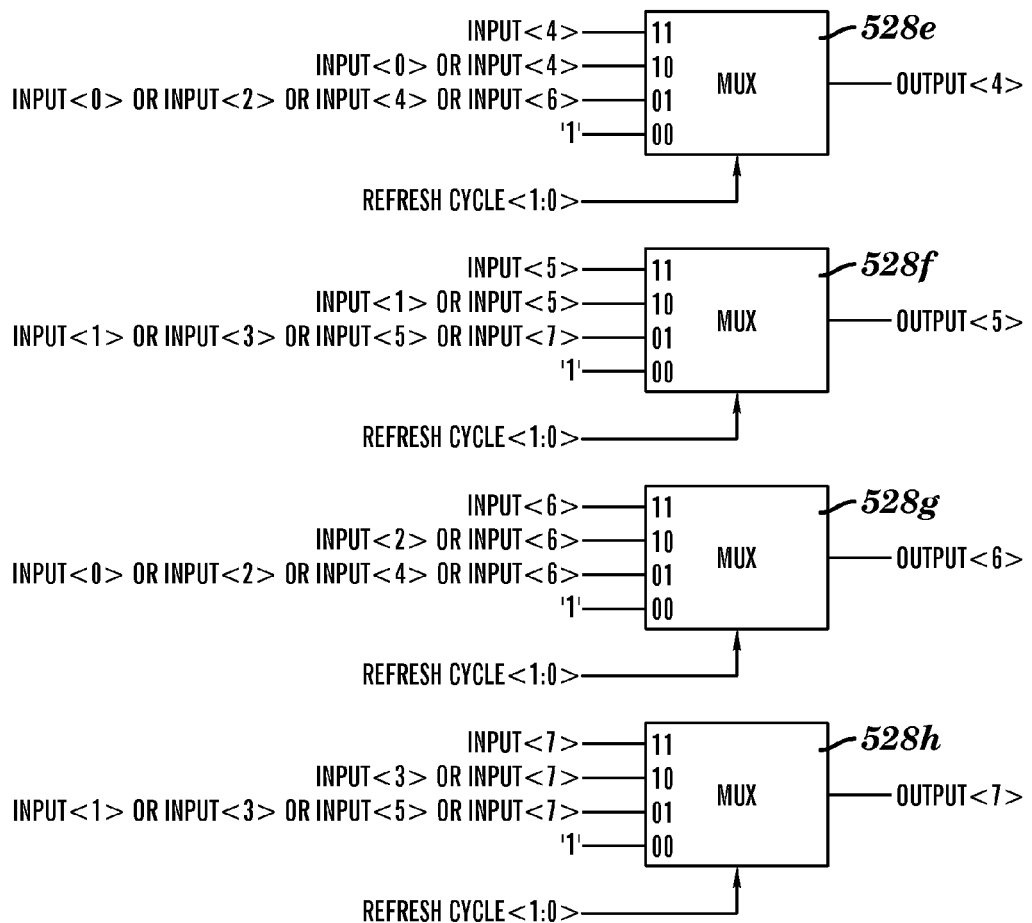

FIG. 6, which includes FIGS. 6A and 6B, is an embodiment of logic 528 in FIG. 5. As described previously, logic 528 uses data from the decoder 506 as input to a multiplexer 602 (inputs 11, 10, and 01) and the refresh cycle mode value 532 as a selector to determine which of the banks should be refreshed in the current refresh cycle.

Figure 7A:
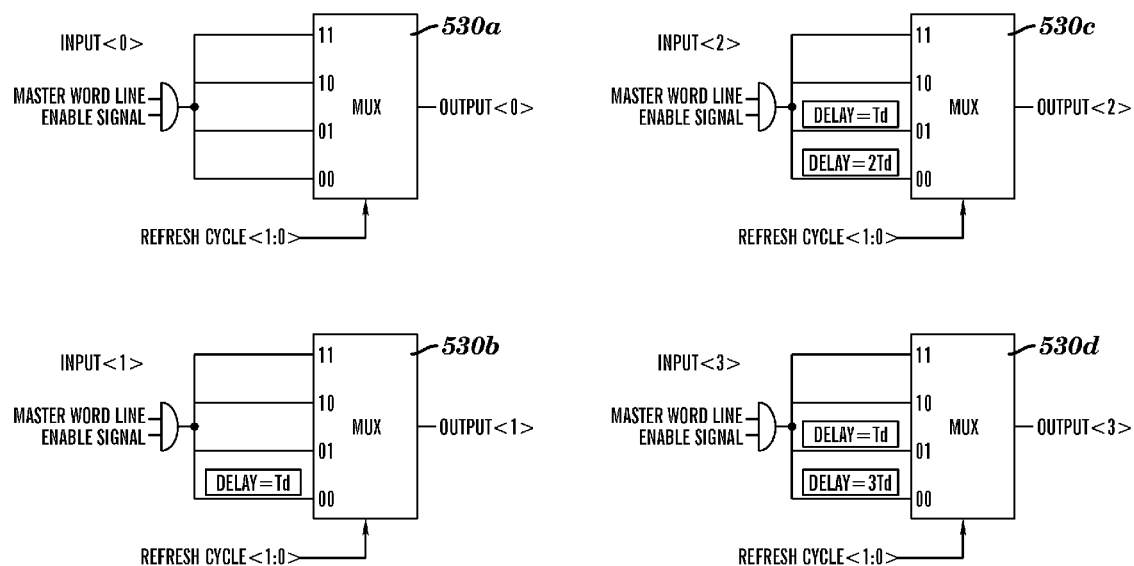
FIGS. 7A and 7B, depicts logic implemented by the memory device depicted in FIG. 5 to provide programmable refresh cycle intervals in accordance with an embodiment.
Figure 7B:
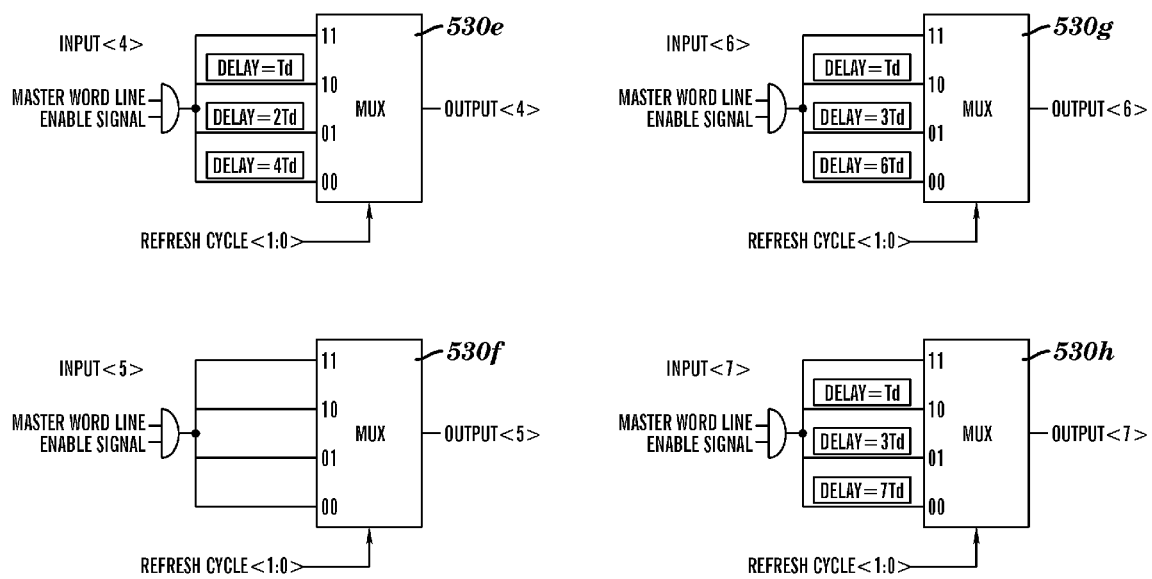

FIG. 7, which includes FIGS. 7A and 7B, is an embodiment of logic 530 in FIG. 5. As described previously, logic 530 inputs data from logic 528 specifying which of the banks should be refreshed in the current refresh cycle ANDed with the master word line enable signal 518 as input to a multiplexer 702, and the refresh cycle mode value 532 as a selector to generate word line enable signals 520 for banks 512 to be refreshed in the current refresh cycle. In addition, the word line enable signals 520 may be subject to delays to stagger the refresh operations to the different banks. These delays are shown as Delay=Td, 2Td, 3Td, 4Td, 5Td, 6Td and 7Td in FIG. 7.

Figure 8:
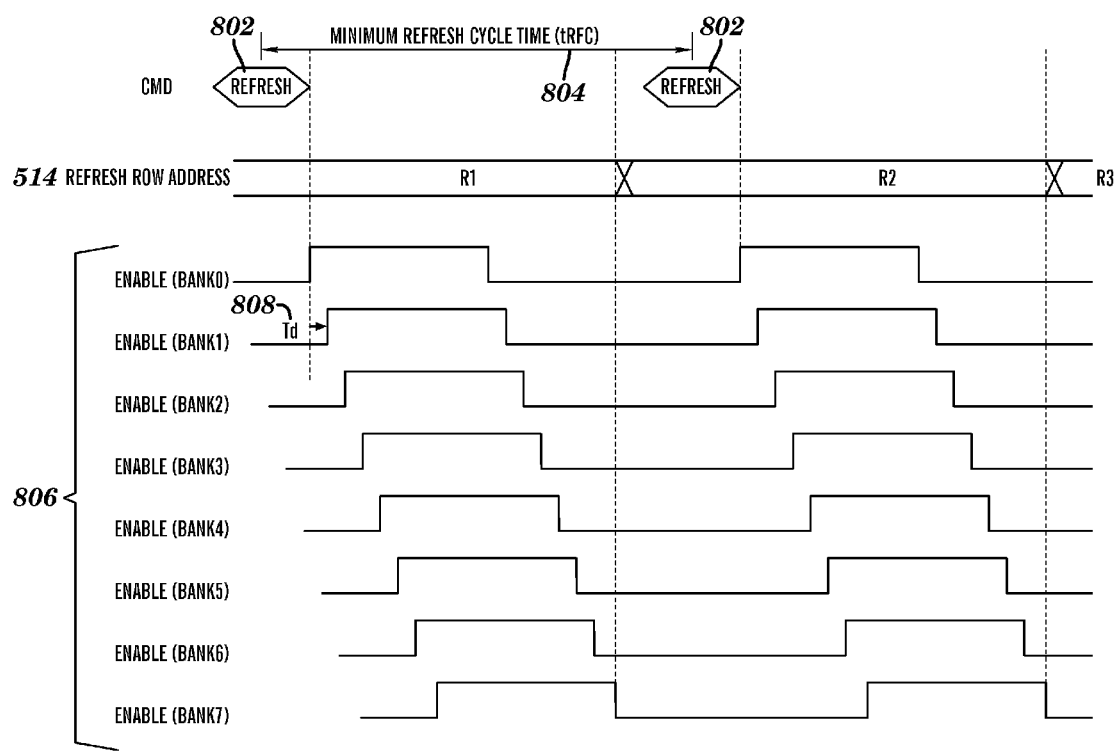
FIG. 8 depicts an internal refresh timing diagram of an embodiment of a memory device where an average refresh cycle interval is set to "X"

FIG. 8 depicts an internal refresh timing diagram of an embodiment of a memory device the tREFI is set to "X", as indicated by the refresh cycle mode value (e.g., "00") stored in the refresh cycle mode register 522. As shown in FIG. 8, a refresh command 802 is issued to a memory device and, and every bank (in this example 8) is refreshed in response to the refresh command (as indicated in FIG. 8 by the bank enable signals 806 being set to high). In response to receiving the refresh command 802, a refresh row address is selected from the counter 504. Depending on how the refresh command 802 is implemented, the refresh command 802 may cause one row or many rows (e.g., starting at row address R1) in each bank to be refreshed. As shown in FIG. 8, the refresh to each bank subsequent to the first bank is staggered by a time delay (Td) 808 or a multiple of the Td 808. Another refresh command 802 (or other command such as a read command or write command) cannot be issued until the tRFC 804 has completed.

Figure 9:
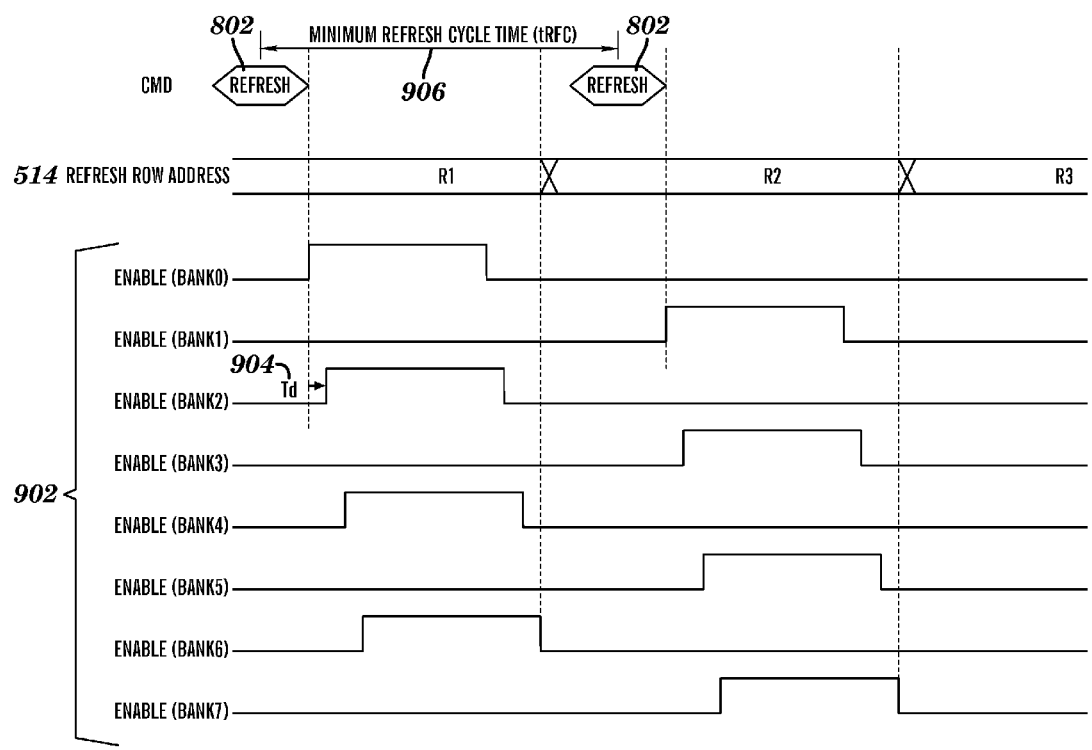
FIG. 9 depicts an internal refresh timing diagram of an embodiment of a memory device where an average refresh cycle interval is set to "X/2"

FIG. 9 depicts an internal refresh timing diagram of an embodiment of a memory device the tREFI is set to "X/2", as indicated by the refresh cycle mode value (e.g., "01") stored in the refresh cycle mode register 522. As shown in FIG. 9, a refresh command 802 is issued to a memory device and, and half of the banks (in this example 4) are refreshed in response to the refresh command 802 (as indicated in FIG. 9 by the bank enable signals 902 being set to high). The other half of the banks, starting at the specified row address, is refreshed in response to receiving the next refresh command from the memory controller. In response to receiving the refresh command 802, a refresh row address 514 is selected from the counter 504. Depending on how the refresh command 802 is implemented, the refresh command 802 may cause one row or many rows (e.g., starting at row address R1) in each of the banks being refreshed to be refreshed. As shown in FIG. 9, the refresh to each bank subsequent to the first bank is staggered by a time delay (Td) 904 or a multiple of the Td 904. Another refresh command 802 (or other command such as a read command or write command) cannot be issued until the tRFC 906 has completed.

Figure 10:
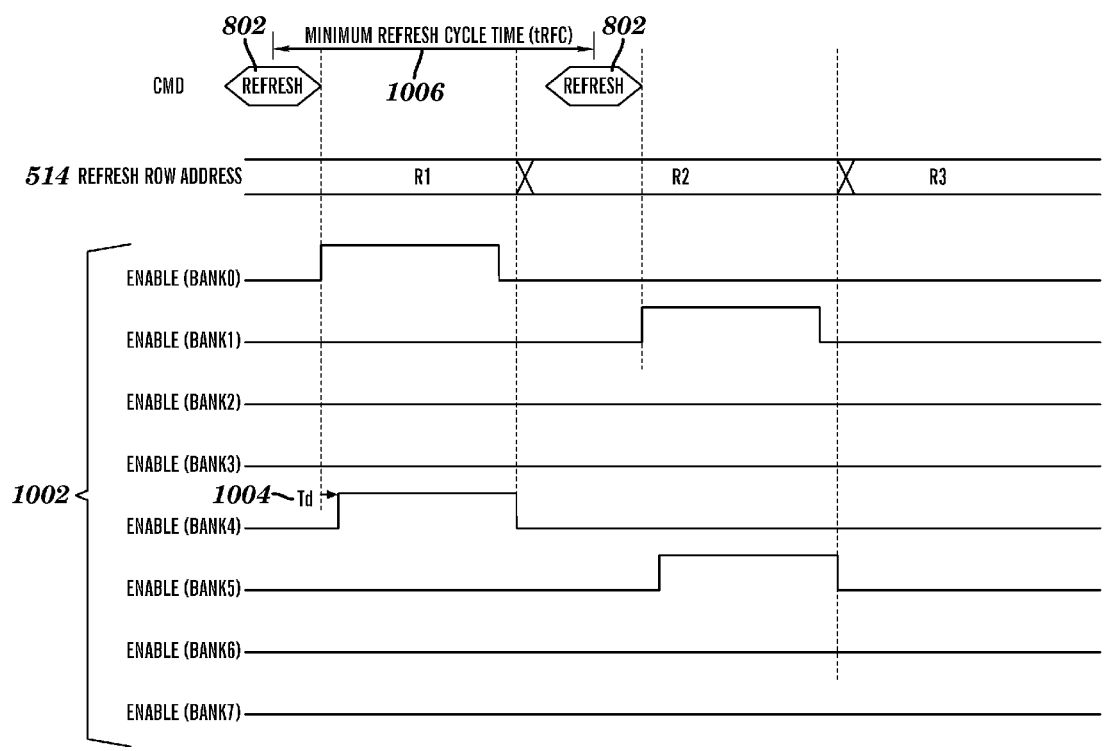
FIG. 10 depicts an internal refresh timing diagram of an embodiment of a memory device where an average refresh cycle interval is set to "X/4"

FIG. 10 depicts an internal refresh timing diagram of an embodiment of a memory device the tREFI is set to "X/4", as indicated by the refresh cycle mode value (e.g., "10") stored in the refresh cycle mode register 522. As shown in FIG. 10, a refresh command 802 is issued to a memory device and, and a quarter of the banks (in this example 2) are refreshed in response to the refresh command 802 (as indicated in FIG. 10 by the bank enable signals 1002 being set to high). The other three quarters of the banks, starting at the specified row address, are refreshed in response to receiving the next three refresh commands from the memory controller. In response to receiving the refresh command 802, a refresh row address 514 is selected from the counter 504. Depending on how the refresh command 802 is implemented, the refresh command 802 may cause one row or many rows (e.g., starting at row address R1) in each of the banks being refreshed to be refreshed. As shown in FIG. 10, the refresh to the second bank (Bank4) is staggered by a time delay (Td) from the refresh to the first bank (Bank0) 904. Another refresh command 802 (or other command such as a read command or write command) cannot be issued until the tRFC 1006 has completed.

Figure 11:
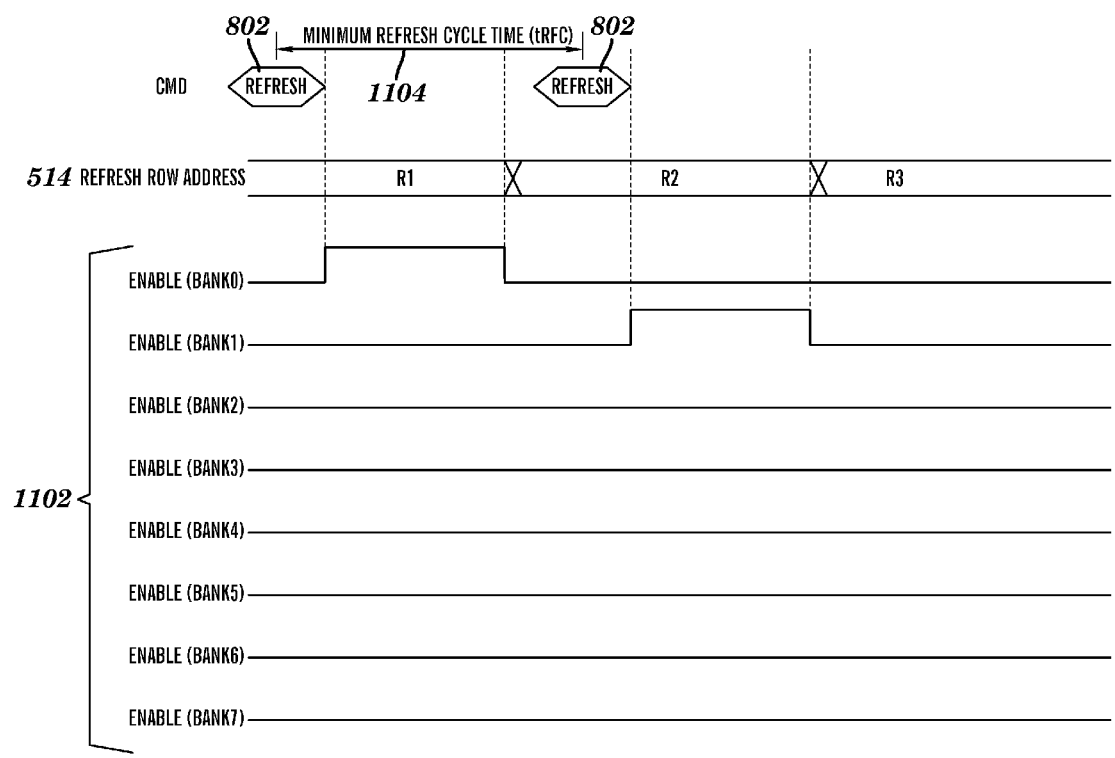
FIG. 11 depicts an internal refresh timing diagram of an embodiment of a memory device where an average refresh cycle interval is set to "X/8"

FIG. 11 depicts an internal refresh timing diagram of an embodiment of a memory device the tREFI is set to "X/8", as indicated by the refresh cycle mode value (e.g., "11") stored in the refresh cycle mode register 522. As shown in FIG. 11, a refresh command 802 is issued to a memory device and, and an eight of the banks (in this example 1) are refreshed in response to the refresh command 802 (as indicated in FIG. 11 by the bank enable signal 1102 being set to high). The other seven eighths of the banks, starting at the specified row address, are refreshed in response to receiving the next seven refresh commands from the memory controller. In response to receiving the refresh command 802, a refresh row address 514 is selected from the counter 504. Depending on how the refresh command 802 is implemented, the refresh command 802 may cause one row or many rows (e.g., starting at row address R1) in each of the banks being refreshed to be refreshed. Another refresh command 802 (or other command such as a read command or write command) cannot be issued until the tRFC 1104 has completed.

FIG. 12 depicts a table 1200 of values that may be stored in a refresh cycle mode register and corresponding tRFC and tREFI values for different memory density values. This table 1200 may be utilized by a memory controller when selecting a refresh cycle mode value to predict corresponding tRFC and tREFI values.

Figure 13:
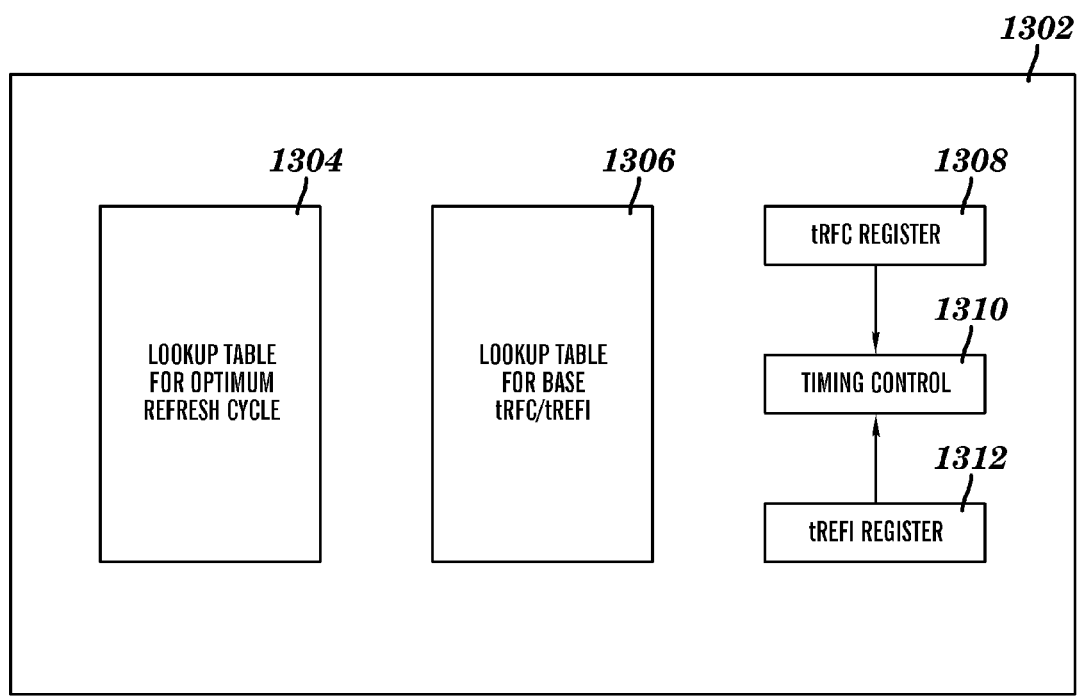
FIG. 13 depicts a block diagram of a memory controller having an optimum refresh cycle lookup table in accordance with an embodiment.
Figure 14:
FIG. 14 depicts values that may be stored in an optimum refresh cycle lookup table in accordance with an embodiment.

FIG. 13 depicts a block diagram of a memory controller 1302 having an optimum refresh cycle lookup table 1304, a base tRFC/tREFI lookup table 1306, a tRFC register 1308, a timing control block 1310, and a tREFI register 1312. In accordance with an embodiment, the optimum refresh cycle lookup table 1304 is utilized by the memory controller 1302 to determine a tREFI setting based on a number of ranks and a DRAM density in a memory system. An embodiment of an optimum refresh cycle lookup table 1400 is depicted in FIG. 14. In accordance with an embodiment, the base tRFC/tREFI lookup table 1304 is utilized by the memory controller to determine a tRFC and tREFI value based on a DRAM density. This timing information is utilized by the memory controller 1302 during normal system operation. An embodiment of a base tRFC/tREFI lookup table 1500 is depicted in FIG. 15. In an embodiment, the memory controller 1302 records the value of tRFCs for memory devices in the tRFC register 1308 tREFI values for the memory devices in the tREFI register 1312. The values in the tRFC register 1308 are used by the timing control block 1310 to aid in determining when to send a memory command subsequent to a refresh command to the memory device(s). The values in the tREFI register 1312 are used to determine how often to send refresh commands to the memory device(s). In addition, the values in the tREFI register 1312 may be utilized by the memory controller 1302 to set the refresh cycle mode value 532 in refresh cycle mode register 522 on one or more memory devices.

Figure 16:
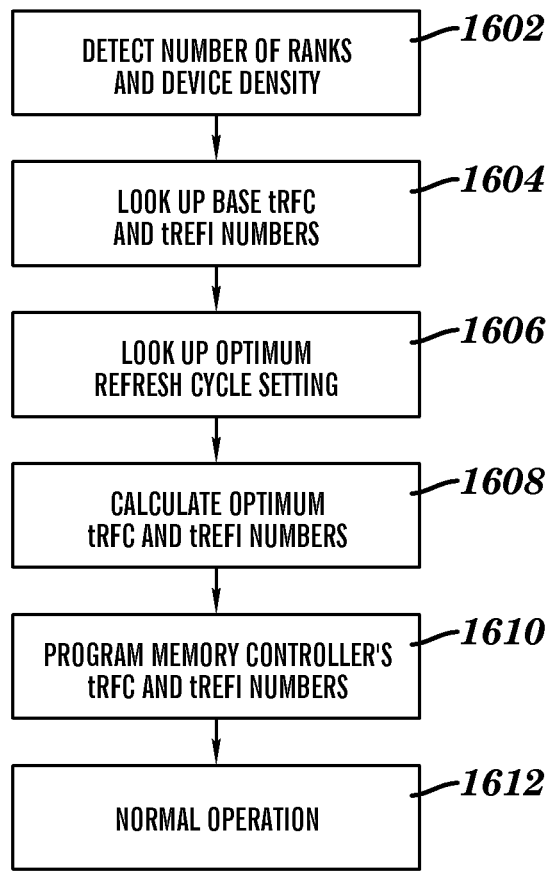
FIG. 16 depicts a process flow that may be implemented by a memory controller in accordance with an embodiment.

FIG. 16 depicts a process flow that may be implemented by a memory controller, such as memory controller 1302, in accordance with an embodiment. In an embodiment, the memory controller includes refresh timing logic (implemented by hardware and/or software) (located, for example in the timing control block 1310 in memory controller 1302) for implementing the process flow depicted in FIG. 16. At block 1602, the memory controller detects the number of ranks and device density for memory devices that are in communication with the memory controller. In an embodiment, where the memory devices are located on memory modules, the memory control performs the detection by reading the serial presence detect (SPD) on the memory module. Blocks 1604 through 1610 are performed for each memory device that is connected to the memory controller. At block 1604, the base tRFC and tREFI numbers are looked up in a table, such as the base tRFC/tREFI lookup table 1500 of FIG. 15. Next, at block 1606 an optimum refresh cycle setting is look up in a table, such as the optimum refresh cycle lookup table 1400 of FIG. 14. At block 1608, an optimum tRFC and tREFI are calculated based on the base tRFC and tREFI numbers, the optimum refresh cycle settings and the device density. The tRFC and tREFI numbers are programmed into the controller and a recycle refresh mode value reflecting the tREFI is written to the refresh cycle mode register 522 in the memory device. At block 1610, the memory controller enters/resumes normal operation where refresh commands are sent once every tREFI.

Technical effects and benefits include the ability to provide a programmable average refresh cycle interval in a memory system, which may lead to improved memory throughput by reducing the lockout time required by refresh operations.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A memory controller comprising:
a table correlating recommended refresh cycle settings to memory system configurations; and
a refresh cycle timing controller configured for:
detecting a memory system configuration, the memory system configuration comprising a density of a memory device;
accessing the table to locate a recommended refresh cycle setting that correlates to the detected memory system configuration;
calculating a refresh cycle time (tRFC) for the memory device in response to the recommended refresh cycle setting and to a base tRFC for the memory device;
calculating a refresh cycle interval (tREFI) for the memory device in response to the recommended refresh cycle setting and to a base tREFI for the memory device; and
transmitting refresh commands to the memory device at the tREFI and waiting for the tRFC to elapse after transmitting each refresh command before transmitting a subsequent command to the memory.

2. The memory controller of claim 1, wherein the refresh cycle timing controller is further configured for programming the memory device with the calculated tREFI, wherein the calculated tREFI corresponds to a number of memory cells to be refreshed on the memory device in response to receiving each of the refresh commands.

3. The memory controller of claim 1, wherein the base tRFC is located in a base tRFC table that correlates the memory density to the base tRFC.

4. The memory controller of claim 1, wherein the base tREFI is located in a base tREFI table that correlates the memory density to the base tREFI.

5. The memory controller of claim 1, wherein the detected memory system configuration comprises a number of ranks.

6. The memory controller of claim 1, wherein the memory device is a dynamic random access memory (DRAM) device.

7. The memory controller of claim 1, wherein the detecting the memory system configuration comprises reading a serial presence detect (SPD).

8. A method for refreshing a memory device, the method comprising:
detecting a memory system configuration, the detecting at a memory controller and the memory system configuration comprising a density of a memory device;
accessing a table that correlates recommend refresh cycle settings to memory system configurations to locate a recommended refresh cycle setting that correlates to the detected memory system configuration;
calculating a refresh cycle time (tRFC) for the memory device in response to the recommended refresh cycle setting and to a base tRFC for the memory device;
calculating a refresh cycle interval (tREFI) for the memory device in response to the recommended refresh cycle setting and to a base tREFI for the memory device; and
transmitting refresh commands to the memory device at the tREFI and waiting for the tRFC to elapse after transmitting each refresh command before transmitting a subsequent command to the memory.

9. The method of claim 8 further comprising programming the memory device with the calculated tREFI, wherein the calculated tREFI corresponds to a number of memory cells to be refreshed on the memory device in response to receiving each of the refresh commands.

10. The method of claim 8, wherein the base tRFC is located in a base tRFC table that correlates the memory density to the base tRFC.

11. The method of claim 8, wherein the base tREFI is located in a base tREFI table that correlates the memory density to the base tREFI.

12. The method of claim 8, wherein the detected memory system configuration comprises a number of ranks.

13. The method of claim 8, wherein the memory device is a dynamic random access memory (DRAM) device.

* * * * *